United States Patent [19]

Shimizu

[11] Patent Number: 4,797,787

[45] Date of Patent: Jan. 10, 1989

[54] LEAD FRAME AND ELECTRONIC DEVICE

[75] Inventor: Ichio Shimizu, Gunma, Japan

[73] Assignee: Hitachi, Ltd., Tokyo, Japan

[21] Appl. No.: 758,030

[22] Filed: Jul. 23, 1985

[30] Foreign Application Priority Data

Jul. 25, 1984 [JP] Japan .................................. 59-152884

[51] Int. Cl.[4] .............................................. H05K 5/02
[52] U.S. Cl. ................................... 361/421; 174/52.4; 357/68; 357/70
[58] Field of Search ............... 174/52 FP; 357/68, 69, 357/70; 361/421

[56] References Cited

U.S. PATENT DOCUMENTS

| | | | |
|---|---|---|---|
| 3,575,678 | 8/1971 | Barton .......................... | 174/52 FP |
| 3,673,309 | 6/1972 | Dalmasso et al. ................. | 361/421 |
| 3,762,039 | 10/1973 | Douglass et al. ............... | 174/52 FP |
| 3,793,474 | 2/1974 | Dunn et al. ....................... | 174/52 FP |
| 3,842,492 | 10/1974 | Kamerbeek et al. ................ | 357/70 |
| 4,303,934 | 12/1981 | Stitt ................................... | 174/52 FP |
| 4,392,152 | 6/1983 | Hirano ................................ | 357/68 |
| 4,514,750 | 4/1985 | Adams ............................... | 357/70 |

FOREIGN PATENT DOCUMENTS 0090503 10/1983 European Pat. Off. .............. 357/70
51-32264 3/1976 Japan .

OTHER PUBLICATIONS

Bond, "Integrated Circuit Lead Frame", Patent Cooperation Treaty (PCT), PCT/US83/00140, 9/15/83.

Primary Examiner—A. D. Pellinen
Assistant Examiner—Gregory P. Thompson
Attorney, Agent, or Firm—Antonelli, Terry & Wands

[57] ABSTRACT

A lead frame and an electronic device incorporating the lead frame wherein the lead frame includes a chip support and a plurality of leads arranged around the chip support with each of the plurality of leads having one end disposed proximate to the chip support. The one end of at least one of the plurality of leads includes a first lead portion extending in a direction toward the chip support and a second lead portion contiguous with the first lead portion. The second lead portion extends in a direction away from the chip support so that the one of the lead has a bent shape.

13 Claims, 6 Drawing Sheets

LEAD FRAME AND ELECTRONIC DEVICE

BACKGROUND OF THE INVENTION

The present invention relates to a lead frame or an electronic device (including also a semiconductor device) which employs the lead frame, and is directed, for example to, a semiconductor device which has a plurality of leads and which is molded in a resin under the state that these leads and a semiconductor chip having a plurality of electrodes are connected by wires.

In a resin-molded type semiconductor device such as IC or LSI, a lead frame is used at the stage of assemblage.

FIG. 2 shows a previously proposed lead frame which is now in use. As shown in the figure, the lead frame is integrally formed with a tab 2 which serves to mount a semiconductor element (chip) 1 thereon, a plurality of leads 3a and 3b (including tab suspension leads 4) which are arranged substantially radiately around the tab 2, a dam 5 which couples the leads, and an outer frame 6 which supports the whole arrangement on the outermost side (such structural arrangement being collectively called the "lead frame"). At a molding step, a structure, in which the desired electrodes of the chip disposed on the tab and the desired leads connected by wires 7 made of, e.g., gold (Au), is molded in a resin. Thereafter, the the dam parts 5 and the outer frame are removed to separate the individual leads, whereby an electronic device is completed.

In this lead frame, the lead portions inside the dam 5 to be molded in the resin are termed the "inner leads" 3a, and the portions outside the dam 5 are termed the "outer leads" 3b.

As partly shown on an enlarged scale in FIG. 3, the inner leads 3a have their fore end parts 3c formed so as to project toward bonding pads 8 which are provided on the peripheral edge of the chip. However, the trend of the packages of semiconductor devices is to have the packages be rendered smaller in size and increased in the number of pins as described in a journal "Nikkei Electronics" published by Nikkei McGraw-Hill Inc., dated June 4, 1984, pp. 141-152. The inventor's study has revealed that the reduction in size and the increase in the number of pins of the packages cause the following problems with respect to the lead frame of FIGS. 2 and 3:

(1) The spacing A between the dam 5 and the tab 2 as indicated in FIG. 3 shortens, so that a length l in the inner lead 3a from the dam to the connection point of the bonding wire decreases. This results in a shorter invasion path of water, which degrades a resistance to moisture.

(2) The depth $B_1$ of the inner lead 3a decreases, so that the mechanical and thermal durabilities of the package decrease and that also the resistance to moisture degrades. More specifically, when the depth $B_1$ decreases, the amount of the resin to be packed in the corresponding space lessens. When a temperature cycle test is conducted under this condition, openings are liable to appear at the interface between the lead frame and the resin on account of the difference of the coefficients of thermal expansion thereof, and eventually, cracks sometimes arise.

Moreover, the resin itself has a water absorptivity. Therefore, when the depth $B_1$ is smaller, water is more prone to reach the bonding wire to that extent, so the resistance to moisture deteriorates.

(3) As the spacing A between the dam 5 and the tab 2 becomes shorter, the magnitude of projection of the fore end of the inner lead is inevitably made smaller. Therefore, a wire bonding area S decreases to that extent, thereby diminishing a bonding deviation margin.

SUMMARY OF THE INVENTION

It is therefore an object of the present invention to overcome the above-noted problems.

In a lead frame for a resin-molded package having a tab for mounting a semiconductor chip thereon, a plurality of leads are arranged around the tab, and a dam and an outer frame coupling the plurality of leads. The present invention provides that some or all of the plurality of leads have end parts which are formed so as to bend or extend in a direction opposite to or in reverse to the direction of those leads extending toward bonding pads arranged on the peripheral edge of the chip which is fixed on the tab.

Owing to such arrangement, the amount of inner leads entering a resin can be sufficiently secured, a long leakage path can be provided, and a large bonding area can be provided on the lead, so that a lead frame for a resin-molded package which is excellent in the points of mechanical strength and resistance to moisture is obtained.

BRIEF DESCRIPTION OF THE DRAWINGS

FIGS. 8 and 9 are partly enlarged sectional views of semiconductor devices showing the states of wire bonding, wherein FIG. 8 illustrates a conventional example and FIG. 9 an example in accordance with the present invention;

DESCRIPTION OF THE PREFERRED EMBODIMENTS

Figure 1:
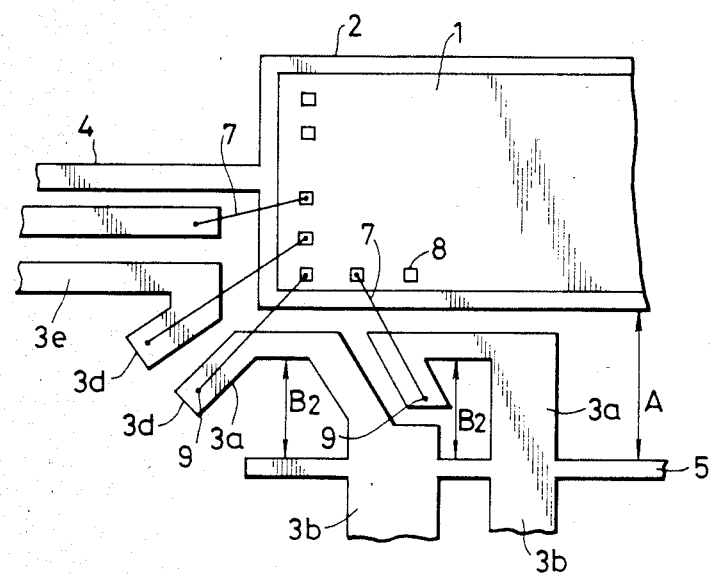
FIG. 1 is a partly enlarged plan view of a lead frame showing an embodiment of the present invention.
Figure 2:
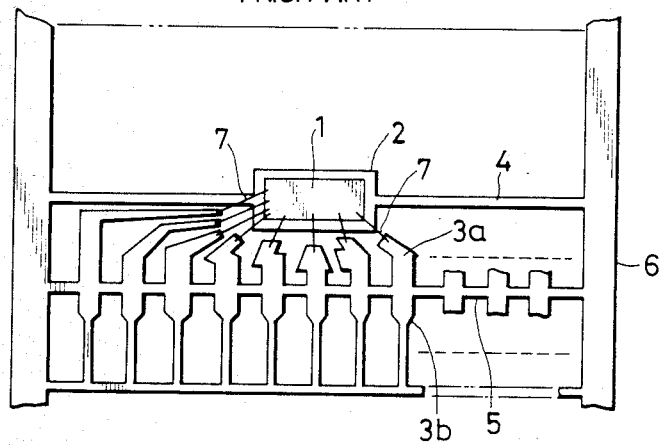
FIG. 2 is a general plan view showing an example of a lead frame.
Figure 3:
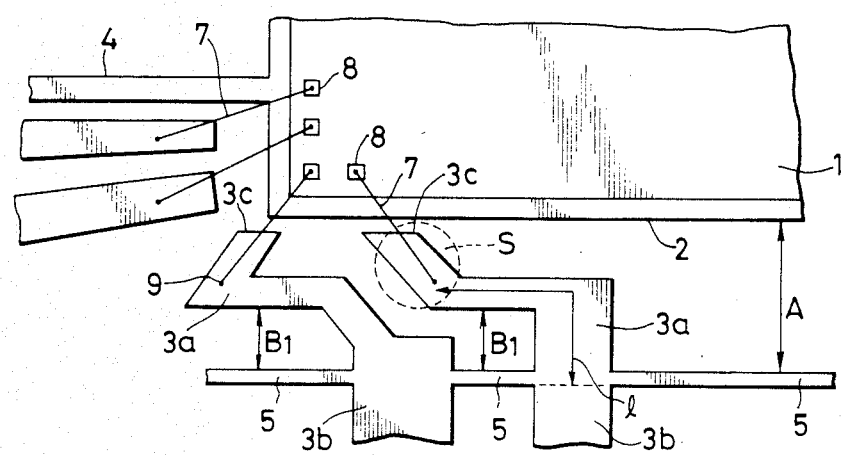
FIG. 3 is an enlarged view of part of a conventional lead frame of the type shown in FIG. 2.

Referring now to the drawings, FIG. 1 shows in plan view one embodiment of the present invention, in which a lead frame for use in the resin-molded package of an IC is partially enlarged. As shown, the lead frame includes a tab 2, a tab suspension lead 4, an inner lead 3a, a dam 5, and an outer lead 3b which are formed as an integral lead frame. A semiconductor chip 1 is mounted on the tab 2 with bonding pads 8 being provided along the peripheral edge of this chip. A bonding wire 7 (for example, Au wire) is connected between one point 9 on the inner lead 3a near the inner end thereof and the bonding pad 8 of the chip 1. The whole lead frame is formed by punching or etching a metal sheet made of Cu or a Cu alloy. If necessary, the surfaces of the tab 2 and the inner leads 3a are formed with plating films of gold (au), silver (Ag) or the like.

As illustrated in FIG. 1, a characterizing feature of the lead frame according to the present invention is that the inner lead 3a inside the dam part 5 of the lead frame is shaped so as to extend toward the tab 2 (or the chip 1) and bent once so that the inner end 3d thereof is formed so as to extend in a sense away from the tab 2. That is, the inner lead 3a includes a first lead portion extending in a direction toward the tab, a second lead portion extending in a direction away from the tab and terminating in the inner end 3d and being contiguous with the first lead portion by way of an interconnecting third lead portion extending in a direction parallel with a peripheral wall of the tab facing the first lead portion. The first, second and third lead portions are contiguous. One end of the wire 7 is bonded by thermocompression by setting a bonding coordinate point at the point 9 lying on the inner end side of the inner lead 3a, while the other end of the wire is bonded to the bonding pad 8 on the side of the chip 1. That is, a principle part of the third lead portion and the inner end 3d of the inner lead 3a lie along a straight line which connects the third lead portion and the wire bonding space on the chip as represented by the bonding wire 7.

Owing to the above construction, even in a slim or thin package in which the dimension between the dam and the tab (called "dimension A") is short, the depth of the inner lead ("dimension $B_2$") is sufficient, so that the amount of a resin to be packed in the corresponding space increases to raise the mechanical and thermal strengths of the package. In addition, since a distance from a surface of a resin-molded package to the bonding point 9 can be maintained sufficiently long, a long leakage path can be provided whereby a semiconductor device having a good resistance to moisture is fabricated. Moreover, a large area can be provided for the fore end part of the inner lead which is bent outwardly from the tab 2 or chip 1, thereby enlarging a wire bonding area, with the result that a large margin for a positional deviation at the wire bonding step can be obtained.

Such inner leads are appropriately adopted principally as shorter leads which are arranged in a place where the spacing A between the tab (chip) and the resin mold line (dam line) is comparatively short. Of course, the construction of the invention can be utilized also for the fore ends of leads in a place where the aforementioned spacing is large, for example, the fore end of a longer lead 3e extending in the direction of the tab suspension lead 4 as shown in FIG. 1. In this case, however, scrupulous care must be taken lest the interval of the leads should increase due to the presence of the bent portions.

Figure 4:
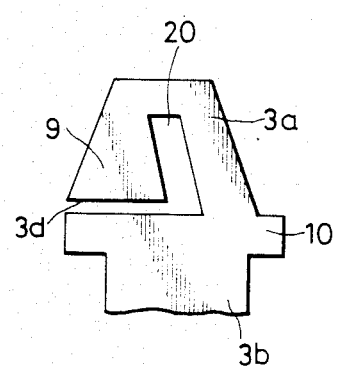
FIG. 4 and FIGS. 5(a) to (g) are enlarged plan views each showing different shapes of lead portions for the lead frame according to the present invention.

In the case of the shorter lead, modifications as shown in FIG. 4 and FIGS. 5(a) to (g) wherein the third lead portion is shortened or substantially eliminated are provided. The lead shown in FIG. 4 has a structure in which the invasion path of water (also termed the "leakage path") is increased or lengthened. In the case of the shorter lead, it is preferable that a protrusion 10 at the root of the first lead portion, for preventing the lead from falling off or pulling away with respect to the resin mold member, is especially provided in a sideward or transverse direction to the lead extension direction. Numeral 20 indicates a space portion, which is filled with the resin at the resin molding step thereby to enhance the resistance to moisture and the reliability of the semiconductor device. As shown in FIG. 4, the second lead portion containing the bonding point 9 or forming the bonding surface has a trapezoidal shape, in plan view, with the lateral width thereof increasing in a direction away from the tab.

Figure 5A:
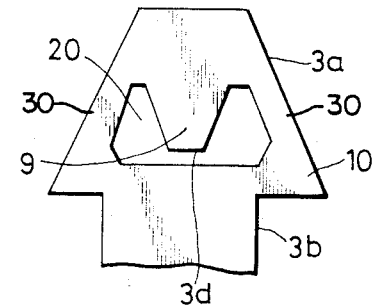

On the other hand, FIG. 5(a) shows another modification wherein the second lead portion also has a trapezoidal shape with the lateral width thereof decreasing in a direction away from the tab. Moreover, this consruction may be considered an elimination of the third lead portion with the first and second portions as described above forming the contiguous inner lead. Thus, essentially first and second contiguous lead portions are provided with the first lead portion being bifurcated into two branches 30 and the second lead portion having the trapezoidal shape being contiguous with the respective branches and folded back in a direction extending away from the tab. As shown, the second lead portion is disposed within a region between the branches 30.

Figure 12:
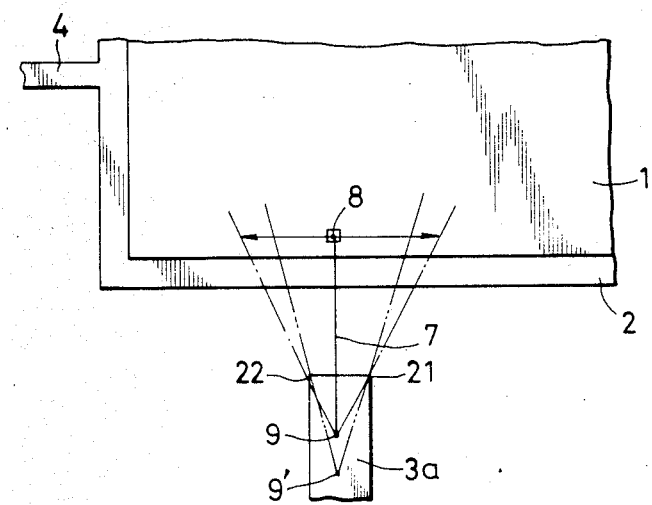
FIG. 12 illustrates a bonding state in accordance with the prior art.
Figure 13:
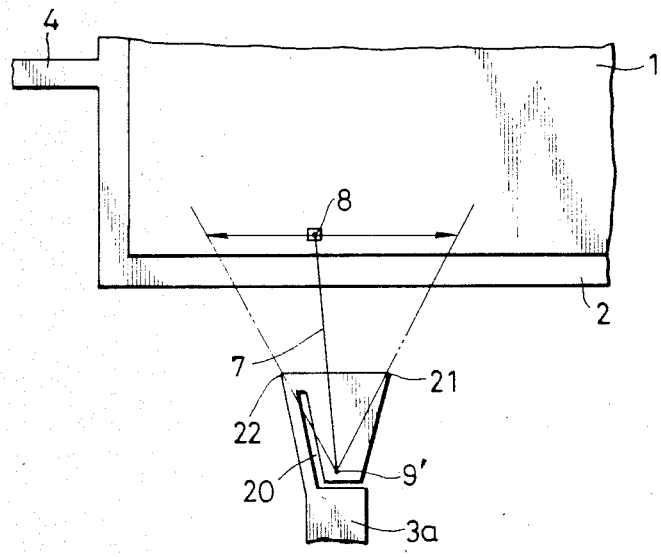
FIG. 13 illustrates a bonding state in accordance with the present invention.
Figure 5B:
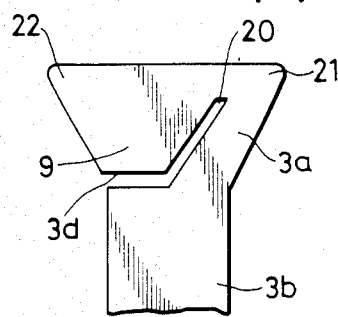

FIG. 5(b) shows another shape wherein lead corners 21 and 22 function also to prevent the lead from falling off. Noteworthy is that the lead portion of trapezoidal shape and serving as a bonding surface spreads fanwise from the inner end 3d of the lead. Therefore, the versatility of arrangement of the bonding pads is enhanced thereby to improve the versatility of design. A technique shown in FIG. 12 is employed as a bonding method for attaining high reliability. To the end of preventing a short-circuit between the wires and a short-circuit between the wire and the tab due to the flow of the wires, the wire 7 is laid within the extent between dot-and-dash lines indicated in the figure. These dot-and-dash lines are straight lines which connect the bonding coordinate point 9 and the corners 21 and 22 at the fore end of the inner lead. Accordingly to this method, the bonding pad 8 can be freely disposed within the extent indicated by arrows in the figure. According to the present invention, the bonding coordinate point 9 is set farther from the chip 1 (or the tab 2) so as to enlarge the bonding area. In this regard, when a coordinate point 9' is merely set farther by the use of a lead having substantially parallel sides as shown in FIG. 12, the versatility of installation of the bonding pad lowers as indicated by two-dot chain lines in the figure. In contrast, according to the present invention, the inner lead spreads fanwise toward the chip, i.e., the sides are non-parallel as shown in FIG. 13, so that even when the bonding coordinate point is set farther at 9', a sufficient versatility of installation of the bonding pad (indicated by arrows) is achieved.

Figure 5C:
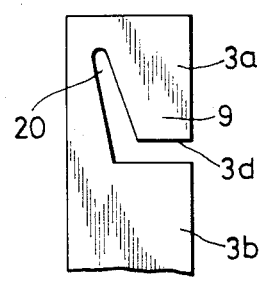
Figure 5D:
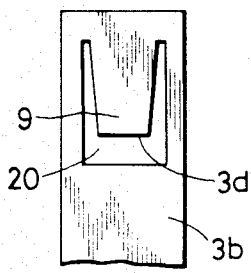

In FIGS. 5(c) and 5(d), the outer lead 3b and the inner lead 3a are set approximately equal widths without providing the protrusion 10 for preventing the lead from falling off. The prevention of the falling-off of the lead is effected in such a way that the amount of the resin to enter the space portion 20 is increased by enlarging the space portion. This lead shape is suitable for increase in the number of pins, and makes it possible to provide a package which can sufficiently meet the requirements of a package having a reduced size and an increased number of pins and which has a high reliability.

Figure 5E:
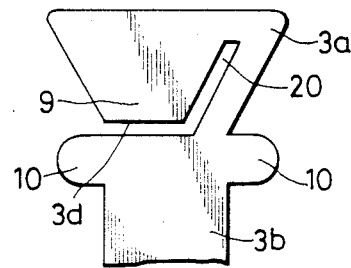

FIG. 5(e) shows a lead in which the protrusions 10 for preventing the lead from falling off are provided at the root of the first lead portion in the lead shape shown in FIG. 5(b), and which affords a high reliability and a high versatility of design.

Figure 5F:
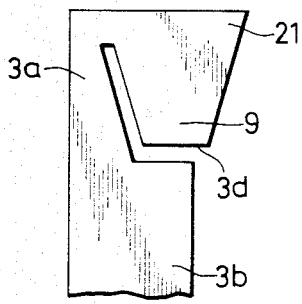

FIG. 5(f) shows a modified structure of the lead shape in FIG. 5(c), in which one side of the inner end 3d of the lead juts beyond the side of the outer lead 3b and functions also to prevent the lead from falling off.

Since the leads of FIGS. 5(c)–5(f) have the bonding leads surfaces of trapezoidal shape spread fanwise in a manner similar to the lead shape of FIG. 5(b), they produce similar effects.

Figure 5G:
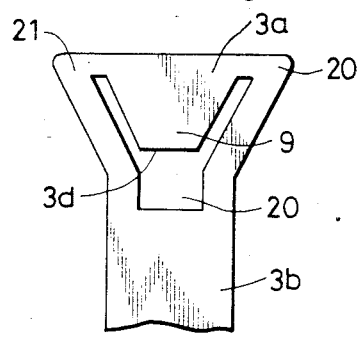

In the lead shape of FIG. 5(g), the corners 20 and 21 of the inner lead function to prevent the lead from falling off, and the space portion 20 is enlarged to achieve further enhancements in reliability and resistance to moisture.

Figure 6:
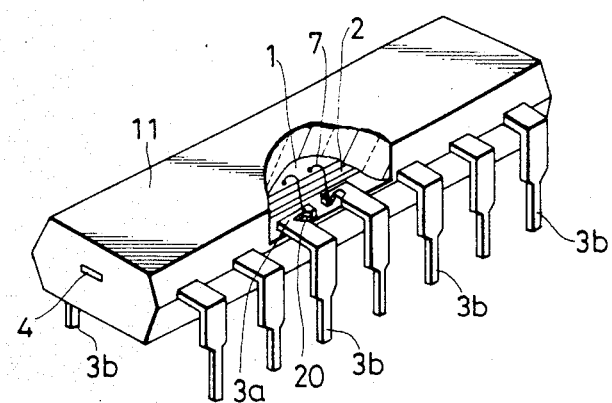
FIG. 6 is a general perspective view, partly cut away, of a resin-molded semiconductor device which uses the lead frame according to the present invention.
Figure 7:
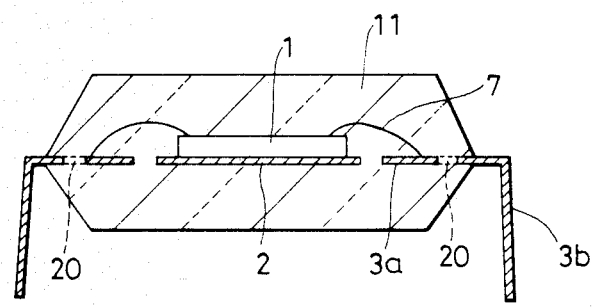
FIG. 7 is a vertical sectional view of the semiconductor device in FIG. 6.

FIG. 6 is a perspective view showing the general configuration of a thin or skinny (slim) type dual in-line package (DIP) resin-molded semiconductor device which uses the lead frame described in the above embodiment and which is partly cut away. The present invention is particularly effective for the thin DIP in which the dimension A on the shorter lead side is small. FIG. 7 is a sectional view showing the internal structure of the semiconductor device shown in FIG. 6. In FIG. 7, numeral 11 designates a resin mold member which serves for sealing the leads, chip, tab and wires with resin. The other structural portions common to the constituent portions shown in FIG. 1 are assigned the same reference symbols.

As seen from the figure, in the elongate type package called the "slim package", the dimension A is very small on the shorter lead side. Therefore, it has heretofore been impossible to satisfactorily attain the resistance to moisture, the mechanical strength, etc., whereas an electronic device excellent in the resistance to moisture, the mechanical strength and the reliability is fabricated by the use of the lead frame of the present invention.

With the lead frame having the internal end of the inner lead as in the aforementioned embodiment described above and the resin-molded semiconductor device employing this lead frame, the following effects are attained:

(1) That an end of an inner lead which lies on the extension of a wire connecting the bonding pad of a chip and a bonding coordinate point on the lead side and which is bent to as to extend in a sense away from the chip is used as a wire bonding area, whereby a sufficient wire bonding area can be provided on the lead.

Figure 8:
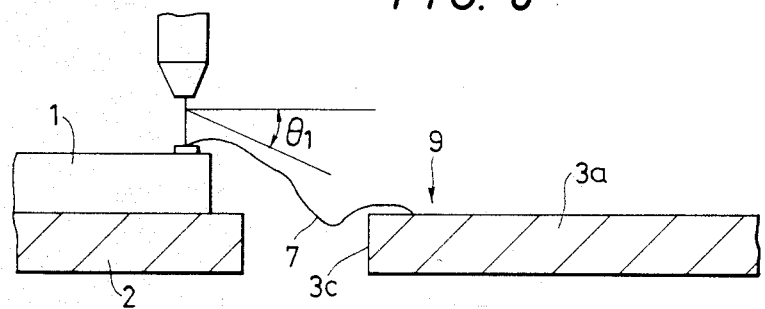

(2) The bonding coordinate point is permitted to be set somewhat (about 0.4 mm) rearward of the end part of the inner lead on the chip side thereof (set closer to an outer lead). Heretofore, since the bonding coordinate point 9 on the inner lead 3a has been set in the vicinity of the chip 1 as illustrated in FIG. 8, a wire 7 has sometimes sagged between a tab 2 and the lead 3a at the wire bonding step. Moreover, since the degree of inclination $\theta_1$ of the wire from the chip side has become great, a wire loop has been able to collapse, and a fault may occur in which the wire short-circuits to the edge of the chip 1.

Figure 9:
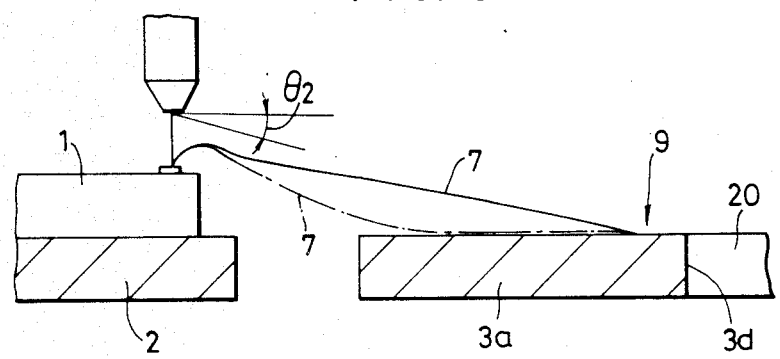

In contrast, in case of the present invention, the bonding coordinate point 9 on the lead is set rearwardly and a wire 7 is accordingly formed so as to extend over a large portion of the lead 3a as illustrated in FIG. 9, whereby the sagging ability of the wire 7 lessens owing to the function that the portion of the lead under the wire supports the wire as indicated by a dot-and-dash line in the figure. Besides, since the angle of inclination $\theta_2$ of the wire is smaller than the angle $\theta_1$ of FIG. 8, a wire loop is less prone to collapse and the possibility of occurrence of a short-circuit to the chip 1 lessens.

(3) The magnitude of an inner lead which enters a resin mold member can be rendered large. Thus, a leakage path from the root of an outer lead to a bonding position on the mold side lengthens to enhance the reliability in regard to the resistance to moisture.

(4) Owing to a shape curved like a "hook", an inner lead is effective to be prevented from falling off a resin mold member.

(5) Since a portion of an inner lead which serves as a bonding surface extends in a direction away from a tab, the magnitude of the inner lead for entering a resin mold member can be increased without enlarging the dimension (dimension A) between the tab and a dam, so that the mechanical strength of a package can be ensured.

(6) Owing to the above items (1), (2), (3), (4) and (5), a high resistance to moisture, a high reliability and a mechanical strength can be obtained without enlarging the dimension A, so that the moisture resistance and the reliability of a small-sized package, the dimension A of which is very small, can be enhanced.

Figure 10:
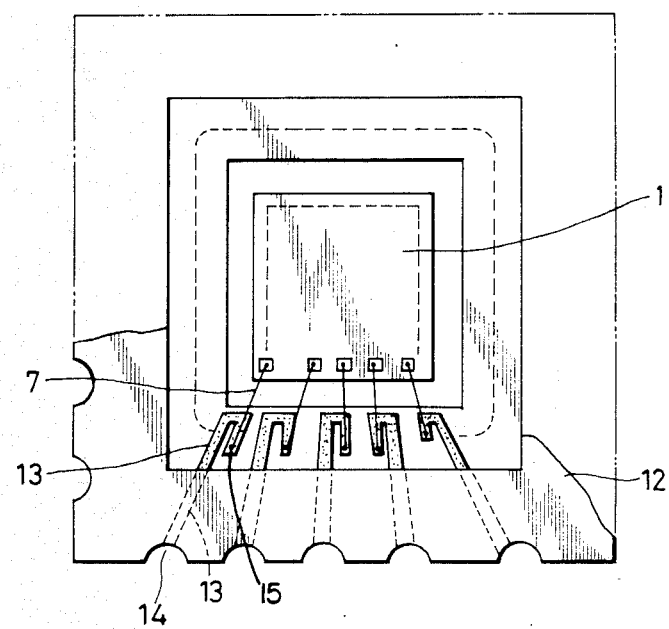
FIG. 10 is a plan view of a glass-molded package semiconductor device showing another embodiment of the present invention.
Figure 11:
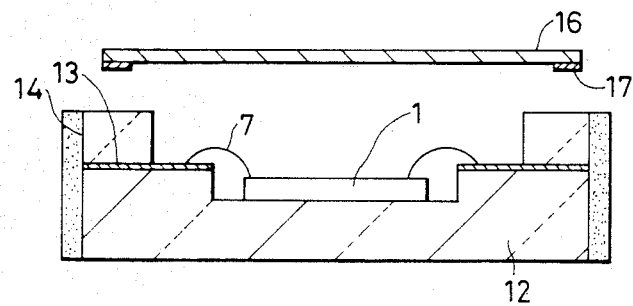
FIG. 11 is a sectional view corresponding to FIG. 10.

FIG. 10 shows in plan view another embodiment of the present invention of the interior of a leadless type glass-encapsulated package, while FIG. 11 is a sectional view corresponding to FIG. 10.

Referring to FIGS. 10 and 11, there is shown a ceramic package base 12 which when provided with a metallized film 13 forming leads serves as a lead frame a semiconductor chip 1 is mounted on the inner surface thereof. The metallized film 13 which corresponds to the lead in the case of the resin encapsulation includes a part thereof which is buried in the ceramic base 12. One side of the interconnection is exposed inside the package, while the other side is connected to a semicircular slot 14 outside the package base. A metallized film is deposited on the inner surface of the slot 14 and lies in contact with a pin (not shown) on a wired board, thereby to effect a wiring connection. As shown in FIG. 10, that part of the metallized interconnection 13 which is exposed inside the package base is bent on its inner side near the chip, and the inner end part 15 thereof extending outwardly away from the chip is used as a bonding portion, which is bonded by a wire 7 with a bonding pad disposed at the peripheral edge of the chip. Numeral 16 denotes a cap made of metal or ceramic, and the space between this cap and the ceramic base is hermetically sealed through a glass film 17 or the like.

With a semiconductor device wherein the inner end of the metallized interconnection of the ceramic package base as described above in the aforementioned embodiment of FIGS. 10 and 11 is formed in the opposite sense (outwards) to the lead-in sense of wire bonding, the following effects are attained:

(1) A sufficient wire bonding area can be provided on a metallized interconnection in a ceramic base.

(2) The sagging ability of a wire can be lessened to lessen the possibility of occurrence of a short-circuit between the edge of a chip and the wire.

While, in the above, the invention has been described in conjunction with several embodiment, it is understood that the present invention is not limited to the foregoing embodiments but is susceptible of numerous changes and modification as would be known to those skilled in the art without departing from the scope of the present invention.

By way of example, in a semiconductor device of the film carrier type wherein leads and a tabs are printed on the surface of a flexible insulating film a semiconductor chip is mounted on the tab, the chip and the leads are subsequently bonded by wires, and the resultant structure is thereafter molded in a resin. When the present invention is applied to the shape of the inner ends of the leads, effects similar to those of the embodiments are attained for securing bonding areas on the leads.

In addition, similar effects are attained even with a configuration in which conventional leads and the leads of the present invention are alternately arranged.

The present invention is applicable to all semiconductor devices and electronic devices of the type having a large number of pins or leads which are connected with the electrodes of a chip by wire bonding.

The present invention is advantageous when utilized especially for small-sized packages intended for high density integration, for example, an elongate package such as of the slim type and a package having a large number of pins since the present invention provides the effects as described above.

What is claimed is:

1. A lead frame comprising:
   chip supporting means for supporting a chip; and
   a plurality of leads arranged around said chip supporting means, each of said plurality of leads having an inner end disposed proximate to said chip supporting means;
   said inner end of at least one of said plurality of leads including a first lead portion extending in a direction toward said chip supporting means, a second lead portion contiguous with said first lead portion, said second lead portion extending in a direction away from said chip supporting means, and a third lead portion connected between said first lead portion and said second lead portion, said third lead portion being contiguous with said first and second lead portions and having a first end connected to said first lead portion and a second end connected to said second lead portion with substantially parallel sides extending between said first and second ends thereof, one of said substantially parallel sides being adjacent to and spaced a predetermined distance from a peripheral wall of said chip supporting means facing said first lead portion and extending in a direction in parallel with said peripheral wall, said second lead portion extending from said second end of said third lead portion in a direction away from said chip supporting means so as to have an end part thereof disposed at a position farther away from said peripheral wall of said chip supporting means than the other of said substantially parallel sides of said third lead portion.

2. A lead frame according to claim 1, wherein said second lead portion extends in a direction away from said chip supporting means so that at least a part of said second lead portion extending in the direction away from said chip supporting means is disposed closer to said chip supporting means than at least part of an inner end of an adjacent one of said plurality of leads and intersects an imaginary extension of said part of said inner end of said adjacent one of said plurality of leads extending in a direction substantially perpendicular to said chip supporting means.

3. A lead frame according to claim 1, wherein said chip supporting means is a tab member.

4. A lead frame according to claim 1, further comprising a substrate having different portions, one portion of said substrate providing said chip supporting means, and said plurality of leads being formed as metallized films disposed on another portion of said substrate.

5. A lead frame according to claim 1, wherein said second lead portion includes a bonding surface for enabling bonding of a wire establishing an electrical connection between said second lead portion and a wire bonding space on the chip.

6. A lead frame according to claim 1, further including a chip wherein the chip includes a wire bonding space thereon for enabling connection of a wire between the wire bonding space and said second lead portion, said second lead portion having a principle surface part thereof lying along a straight line extending between the wire bonding space on the chip and a connection point of said second lead portion.

7. A lead frame according to claim 1, wherein said second lead portion has a trapezoidal shape said trapezoidal shape having a lateral width which decreases in a direction away from said chip supporting means.

8. A lead frame according to claim 1, wherein said second lead portion has a trapezoidal shape, said trapezoidal shape having a lateral width which increases in a direction away from said chip supporting means.

9. A lead frame according to claim 1, wherein said first lead portion is bifurcated into branches, said second lead portion being contiguous with the respective branches and extending in a direction away from said chip supporting means so as to be disposed within a region between said branches.

10. A lead frame comprising:
    chip supporting means for supporting a chip; and
    a plurality of leads arranged around said chip supporting means, each of said plurality of leads having an inner end disposed proximate to said chip supporting means;
    said inner end of at least one of said plurality of leads including a first lead portion extending in a direction toward said chip supporting means and having an end part proximate to said chip supporting means, and a second lead portion contiguous with said first lead portion, said second lead portion extending in a direction away from said chip supporting means so that at least a part of said second lead portion extending in the direction away from said chip supporting means has an end portion which is the end of said inner end of said at least one of said plurality of leads disposed at a position farther away from said chip supporting means than said end part of said first lead portion and disposed closer to said chip supporting means than at least part of an inner end of an adjacent one of said plurality of leads, said part of said second lead portion being disposed so as to intersect an imaginary extension of said part of said inner end of said adjacent one of said plurality of leads extending in a direction substantially perpendicular to said chip supporting means.

11. An electronic device comprising:
    a semiconductor chip;
    a plurality of leads arranged around said chip supporting means, each of said plurality of leads having an inner end disposed proximate to said chip supporting means;

said chip being secured to said chip supporting means;

wires electrically connecting said leads and said chip; and sealing means sealing said leads, said chip supporting means and said wires;

said inner end of at least one of said plurality of leads including a first lead portion extending in a direction toward said chip supporting means and having an end part proximate to said chip supporting means, and a second lead portion contiguous with said first lead portion, said second lead portion extending away from said chip supporting means and having an end portion which is the end of said inner end of said at least one of said plurality of leads and is disposed at a position farther away from said chip supporting means than said end part of said first lead portion, said second lead portion having a bonding surface point thereof at a position disposed farther from said chip supporting means than another position thereof for enabling bonding of one of said wires thereat to establish an electrical connection between said second lead portion and a wire bonding space on said chip.

12. An electronic device according to claim 11, wherein said second lead portion extends in a direction away from said chip supporting means so that at least a part of said second lead portion extending in the direction away from said chip supporting means is disposed closer to said chip supporting means than at least part of an inner end of an adjacent one of said plurality of leads and intersects an imaginary extension of said part of said inner end of said adjacent one of said plurality of leads extending in a direction substantially perpendicular to said chip supporting means.

13. An electronic device according to claim 11, wherein said inner end of said at least one of said plurality of leads includes a third lead portion connected between said first lead portion and said second lead portion, said third lead portion being contiguous with said first and second lead portions and having a first end connected to said first lead portion and a second end connected to said second lead portion with substantially parallel sides extending between first and second ends thereof, one of said substantially parallel sides being spaced a predetermined distance from a peripheral wall of said chip supporting means facing said first lead portion and extending in a direction in parallel with said peripheral wall, said second lead portion extending from said second end of said third lead portion in a direction away from said chip supporting means so as to have an end part thereof disposed at a position farther away from said peripheral wall of said chip supporting means than the other of said substantially parallel sides of said third lead portion, said bonding surface point being disposed at said end part of said second lead portion.

* * * * *